United States Patent
Avraham et al.

(10) Patent No.: US 8,665,645 B2
(45) Date of Patent: Mar. 4, 2014

(54) DRIFT COMPENSATION IN A FLASH MEMORY

(75) Inventors: Meir Avraham, Rishon Lezion (IL); Amir Ronen, Hod Hasharon (IL)

(73) Assignee: Sandisk IL Ltd., Kfar Saba (IL)

( * ) Notice: Subject to any disclaimer, the term of this patent is extended or adjusted under 35 U.S.C. 154(b) by 329 days.

(21) Appl. No.: 13/073,771

(22) Filed: Mar. 28, 2011

(65) Prior Publication Data

US 2011/0170349 A1 Jul. 14, 2011

Related U.S. Application Data

(60) Division of application No. 11/591,641, filed on Nov. 2, 2006, now Pat. No. 7,957,189, which is a division of application No. 11/206,033, filed on Aug. 18, 2005, now Pat. No. 7,817,469, which is a continuation-in-part of application No. 10/898,241, filed on Jul. 26, 2004, now Pat. No. 7,437,498.

(60) Provisional application No. 60/624,233, filed on Nov. 3, 2004, provisional application No. 60/624,234, filed on Nov. 3, 2004.

(51) Int. Cl.
*G11C 11/34* (2006.01)
*G11C 16/06* (2006.01)

(52) U.S. Cl.
USPC .................................. 365/185.09; 365/185.22

(58) Field of Classification Search
USPC ........................................ 365/185.09, 185.22
See application file for complete search history.

(56) References Cited

U.S. PATENT DOCUMENTS

| | | | |
|---|---|---|---|
| 5,270,979 | A | 12/1993 | Harari |
| 5,369,615 | A | 11/1994 | Harari |
| 5,404,485 | A | 4/1995 | Ban |
| 5,864,504 | A | 1/1999 | Tanzawa et al. |
| 5,909,390 | A | 6/1999 | Harari |
| 6,011,715 | A | 1/2000 | Pasotti et al. |
| 6,026,023 | A | 2/2000 | Tonda |
| 6,400,638 | B1 | 6/2002 | Yamada et al. |
| 6,649,514 | B1 | 11/2003 | Jiang et al. |
| 6,662,263 | B1 | 12/2003 | Wong |

(Continued)

FOREIGN PATENT DOCUMENTS

| WO | WO2005/010638 | 2/2005 |
|---|---|---|
| WO | WO2005/010869 | 2/2005 |

OTHER PUBLICATIONS

Restriction Requirement dated Sep. 19, 2006, U.S. Appl. No. 11/206,033, filed Aug. 18, 2005.

(Continued)

*Primary Examiner* — Vanthu Nguyen
(74) *Attorney, Agent, or Firm* — Vierra Magen Marcus LLP

(57) ABSTRACT

A plurality of memory cells are managed by obtaining values of one or more environmental parameters of the cells and adjusting values of one or more reference voltages of the cells accordingly. Alternatively, a statistic of at least some of the cells, relative to a single reference parameter that corresponds to a control parameter of the cells, is measured, and the value of the reference voltage is adjusted accordingly. Examples of environmental parameters include program-erase cycle count, data retention time and temperature. Examples of reference voltages include read reference voltages and program verify reference voltages. Examples of statistics include the fraction of cells whose threshold voltages exceed initial lower bounds or initial medians.

12 Claims, 6 Drawing Sheets

(56) References Cited

U.S. PATENT DOCUMENTS

| | | | |
|---|---|---|---|
| 6,714,449 | B2 | 3/2004 | Khalid |
| 6,744,670 | B2 * | 6/2004 | Tamada et al. ............ 365/185.19 |
| 6,751,766 | B2 | 6/2004 | Guterman |
| 6,870,766 | B2 | 3/2005 | Cho et al. |
| 6,903,972 | B2 | 6/2005 | Lasser |
| 6,967,867 | B2 | 11/2005 | Hamaguchi |
| 7,209,390 | B2 | 4/2007 | Lue et al. |
| 7,339,834 | B2 * | 3/2008 | Lutze ....................... 365/185.28 |
| 2002/0092030 | A1 | 7/2002 | Gu |
| 2005/0013165 | A1 | 1/2005 | Ban |
| 2005/0024978 | A1 | 2/2005 | Ronen |

OTHER PUBLICATIONS

Response to Restriction Requirement filed Oct. 18, 2006, U.S. Appl. No. 11/206,033, filed Aug. 18, 2005.
Office Action dated Oct. 31, 2006, U.S. Appl. No. 11/206,033, filed Aug. 18, 2005.
Response to Office Action filed Jan. 29, 2007, U.S. Appl. No. 11/206,033, filed Aug. 18, 2005.
Response to Notice of Non-Compliant Amendment filed Oct. 29, 2007, U.S. Appl. No. 11/206,033, filed Aug. 18, 2005.
Office Action dated Mar. 25, 2009, U.S. Appl. No. 11/206,033, filed Aug. 18, 2005.
Response to Office Action filed Jun. 25, 2009, U.S. Appl. No. 11/206,033, filed Aug. 18, 2005.
Office Action dated Aug. 25, 2009, U.S. Appl. No. 11/206,033, filed Aug. 18, 2005.
Response to Office Action filed Nov. 25, 2009, U.S. Appl. No. 11/206,033, filed Aug. 18, 2005.
Office Action dated Jan. 12, 2010, U.S. Appl. No. 11/206,033, filed Aug. 18, 2005.
Response to Office Action filed Apr. 12, 2010, U.S. Appl. No. 11/206,033, filed Aug. 18, 2005.
Notice of Allowance dated Jun. 16, 2010, U.S. Appl. No. 11/206,033, filed Aug. 18, 2005.
Preliminary Amendment filed Jan. 14, 2008, U.S. Appl. No. 11/591,641, filed Nov. 2, 2006.
Office Action dated Feb. 2, 2009, U.S. Appl. No. 11/591,641, filed Nov. 2, 2006.
Response to Office Action filed Jul. 2, 2009, U.S. Appl. No. 11/591,641, filed Nov. 2, 2006.
Restriction Requirement dated Sep. 25, 2009, U.S. Appl. No. 11/591,641, filed Nov. 2, 2006.
Response to Restriction Requirement filed Oct. 15, 2009, U.S. Appl. No. 11/591,641, filed Nov. 2, 2006.
Office Action dated Dec. 2, 2009, U.S. Appl. No. 11/591,641, filed Nov. 2, 2006.
Response to Office Action filed Mar. 2, 2010, U.S. Appl. No. 11/591,641, filed Nov. 2, 2006.
Office Action dated Jun. 9, 2010, U.S. Appl. No. 11/591,641, filed Nov. 2, 2006.
Response to Office Action filed Sep. 9, 2010, U.S. Appl. No. 11/591,641, filed Nov. 2, 2006.
Office Action dated Oct. 19, 2010, U.S. Appl. No. 11/591,641, filed Nov. 2, 2006.
Response to Office Action filed Jan. 19, 2011, U.S. Appl. No. 11/591,641, filed Nov. 2, 2006.
Notice of Allowance dated Feb. 10, 2011, U.S. Appl. No. 11/591,641, filed Nov. 2, 2006.
Korean Office Action dated Jul. 2, 2009, Korean Patent Application No. 10-2007-7010084.

* cited by examiner

DRIFT COMPENSATION IN A FLASH MEMORY

CLAIM OF PRIORITY

This application is a divisional application of U.S. patent application Ser. No. 11/591,641, entitled "DRIFT COMPENSATION IN A FLASH MEMORY," filed Nov. 2, 2006, which is a divisional application of U.S. Pat. No. 7,817,469 issued Oct. 19, 2010, which is a Continuation-in-Part application of U.S. Pat. No. 7,437,498 issued Oct. 14, 2008 and claims the benefit of U.S. Provisional Patent Applications Nos. 60/624,233 and 60/624,234, both filed Nov. 3, 2004.

BACKGROUND

The present invention relates to the management of non-volatile memories and, more particularly, to a method of managing a memory such as a flash memory whose physical representation of the data stored therein tends to drift over time.

FIG. 1 illustrates the storage of a bit, either a zero bit or a one bit, in a cell of an electrically programmable memory (EPROM) such as a flash memory. For historical reasons, this process of storing data in a EPROM is called "programming" the EPROM. Specifically, the cell that is the subject of FIG. 1 stores one bit of data, and so commonly is called a single-level cell (SLC). Initially, the cell has a nominal threshold voltage $V_1$ that represents a one bit. For example, after a block of a flash memory has been erased, all the cells have nominal threshold voltages $V_1$. Because of unavoidable inaccuracies in the initializations of the cells, the actual threshold voltages are distributed around the nominal threshold voltage $V_1$ according to a distribution curve 10. Then, to each cell that is to store a zero bit, a train of programming voltage pulses is applied, in order to inject electrons from the cell's silicon substrate through the cell's oxide layer into the cell's floating gate, until the cell's threshold voltage exceeds a reference "program verify" threshold voltage $V_0$ that represents a zero bit. Because the electrons move through the oxide layer by quantum mechanical tunneling or by hot injection, because of non-uniformities in the cells' structures, and because the initial threshold voltages are distributed according to distribution curve 10, the threshold voltages of the cells that store zero bits are distributed above $V_0$ according to a distribution curve 12.

A cell is read by comparing the cell's threshold voltage to a reference "read" threshold voltage $V_R$ that is above distribution curve 10 but below $V_0$. If the cell's threshold voltage is below $V_R$ then the cell's contents are read as a one bit. If the cell's threshold voltage is at or above $V_R$ then the cell's contents are read as a zero bit.

Several factors influence the accuracy with which flash memory cells are read and hence the reliability of data storage by the flash memory cells. The two most important ones are data retention time and program/erase (P/E) cycle history:

1. Data Retention Time

Over time, the threshold voltages of the cells that store zero bits tend to drift downwards. Also shown in FIG. 1, in phantom, is a distribution curve 14 that represents the distribution of the threshold voltages of the cells that have been programmed to store zero bits after the passage of a considerable amount of time. $V_1$, $V_R$ and $V_0$ are selected to be sufficiently far apart to preserve the reliability of the flash memory despite this drift of the threshold voltages.

One goal of the designers of flash memories is to reduce the cost per bit of storing data. This is accomplished in two ways. The first way is to use fabrication processes that cram more cells into the same semiconductor area. The second way is to use multi-level cells (MLCs) that store more than one bit per cell. Both ways of reducing costs decrease the retention time of the data. For example, multiple bits are stored in a MLC by defining $2^n$ voltage bands, to store n bits, in place of the two voltage bands (above and below $V_R$) of a SLC. Because the voltage bands of a MLC are necessarily closer together than the voltage bands of a comparable SLC, the threshold voltage of a MLC that has been programmed to store one or more zero bits drifts down to the next band down sooner than the threshold voltage of a comparable SLC drifts below $V_R$.

2. P/E Cycle History

A programmed block of flash memory cells must be erased before any of its cells can be programmed again. A sequence of programming operations directed at cells of a block of flash cells, followed by the erasure of the block, is called a program-erase (P/E) cycle.

A block of flash cells is limited as to how many P/E cycles it can endure. If the number of P/E cycles exceeds a certain upper bound, it cannot be guaranteed that the cells can be read accurately. Even if, as is standard, error correction procedures such as the appending of error correction bits are used, there still is, for any given error correction procedure, a maximum number of P/E cycles beyond which the error correction procedure cannot be guaranteed reliable. Typically, each block of a SLC NAND flash memory is expected to withstand 100,000 P/E cycles and each block of a MLC NAND flash memory is expected to withstand 10,000 P/E cycles.

Data retention time and P/E cycle history are interdependent. A block of flash cells that has endured many P/E cycles tends to have faster threshold voltage drift and hence a shorter data retention time than a block of flash cells that has endured few P/E cycles.

Other factors that influence the reliability of data storage in flash memory cells include:

Program Disturb: the effect on a cell of programming an adjacent cell.

Temperature: both the temperature at which a flash memory is stored and the temperature at which a flash memory is read.

There is thus a widely recognized need for, and it would be highly advantageous to have, a method of managing a non-volatile memory such as a flash memory in a manner that compensates for these factors.

SUMMARY

According to the present invention there is provided a method of managing a plurality of memory cells, including the steps of: (a) obtaining a respective value of at least one environmental parameter of the plurality of memory cells; and (b) adjusting a respective value of at least one reference voltage of the plurality of memory cells in accordance with the at least one obtained value.

According to the present invention there is provided a memory device, including: (a) a plurality of memory cells; and (b) a controller operative to manage the plurality of memory cells by: (i) obtaining a respective value of at least one environmental parameter of the plurality of memory cells, and (ii) adjusting a respective value of at least one reference voltage of the plurality of memory cells in accordance with the at least one obtained value.

According to the present invention there is provided a method of managing a plurality of memory cells, including the steps of: (a) measuring a statistic of at least some of the memory cells relative to a single respective reference parameter of a reference voltage of the plurality of memory cells; and (b) adjusting a respective value of the reference voltage in accordance with the measured statistic.

According to the present invention there is provided a memory device, including: (a) a plurality of memory cells; and (b) a controller operative to manage the plurality of memory cells by: (i) measuring a statistic of at least some of the memory cells relative to a single respective reference parameter of a reference voltage of the plurality of memory cells, and (ii) adjusting a respective value of the reference voltage in accordance with the measured statistic.

The methods of the present invention are methods of managing a plurality of memory cells, for example a block or a page of flash cells.

According to the first basic method of the present invention, respective values of one or more environmental parameters of the cells are obtained and respective values of one or more reference voltages of the cells are adjusted accordingly. Examples of environmental parameters include historical parameters such as the program-erase cycle count of the cells (for which the corresponding value is the number of program-erase cycles that the cells have endured) and the data retention time of the cells, and the temperature of the cells. How the value of an environmental parameter is "obtained" depends on the nature of the parameter. For example, the value of a program-erase cycle count is obtained by counting program-erase cycles, and the value of a temperature is obtained by measuring the temperature. Examples reference voltages include read reference voltages and program verify reference voltages.

One important preferred embodiment of the first method is that in which respective values of a plurality of reference voltages of respective threshold voltage bands are adjusted. The value of each reference voltage is adjusted in a manner specific to the corresponding threshold voltage band.

According to the second basic method of the present invention, a statistic of at least some of the cells is measured relative to a single reference parameter that corresponds to a reference voltage of the cells. The value of the reference voltage then is adjusted in accordance with the corresponding measured statistic. Examples of reference voltages include read reference voltages and program verify reference voltages. Examples of statistics include statistics of threshold voltages, relative to reference parameters that are related to initial distributions of the threshold voltages, for example, lower bounds of the initial distributions or medians of the initial distributions.

Preferably, the second method of the present invention also includes programming the cells to store data. More preferably, the measuring of the statistics is delayed relative to the programming by a predetermined wait time. Also more preferably, the second method of the present invention also includes selecting the cells whose statistics are measured in accordance with the data. Most preferably, the selecting includes reading the data from the cells, and the reading and measuring are iterated to select the cells.

Optionally, the statistics are measured for all of the cells.

The scope of the present invention also extends to memory devices. A memory device of the present invention includes a plurality of memory cells and a controller that manages the cells according to a method of the present invention.

Harari et al., in U.S. Pat. No. 5,270,979, teaches similar methods for adjusting the values of voltages that are applied to the cells of flash memories to erase those cells. Ronen, in US Patent Application Publication No. 2005/0024978, teaches similar methods for adjusting the values of voltages that are applied to the cells of flash memories to program those cells. Nevertheless, and although the methods of Harari et al. were published in 1993, it has not been known to adjust the values of reference voltages as taught herein.

BRIEF DESCRIPTION OF THE DRAWINGS

The invention is herein described, by way of example only, with reference to the accompanying drawings, wherein.

DETAILED DESCRIPTION

The present invention is of a method of managing a plurality of memory cells so that the contents of the cells are read accurately despite the factors described above that cause errors in the reading of the contents of the cells. Specifically, the present invention can be used to extend the useful lifetime of a flash memory device.

The principles and operation of memory cell management according to the present invention may be better understood with reference to the drawings and the accompanying description.

The present invention is described herein with respect to the management of flash memory devices. Although the description herein focuses on SLC flash memory devices for the sake of expository simplicity, it should be borne in mind that the present invention is equally applicable to MLC flash memory devices. Indeed, the present invention is more important for MLC flash memory devices than for SLC flash memory devices because the former are more sensitive than the latter to threshold voltage drift. Furthermore, although the preferred embodiments of the present invention that are described herein are intended for the management of flash memory devices, it will be clear to those skilled in the art how the present invention can be applied to the management of other non-volatile memory devices, or indeed to the management of memory devices generally.

The general idea of the present invention is to adjust the values of one or more reference voltages of a memory to compensate for the factors that lead to inaccurate or unreliable reading of the contents of the cells of the memory. Examples of such reference voltages include, in the case of a SLC flash memory, read threshold voltage $V_R$ and program verify threshold voltage $V_0$, and in the case of a MLC flash memory, the respective read threshold voltages and program verify threshold voltages of the voltage bands above the lowest voltage band.

Figure 6:
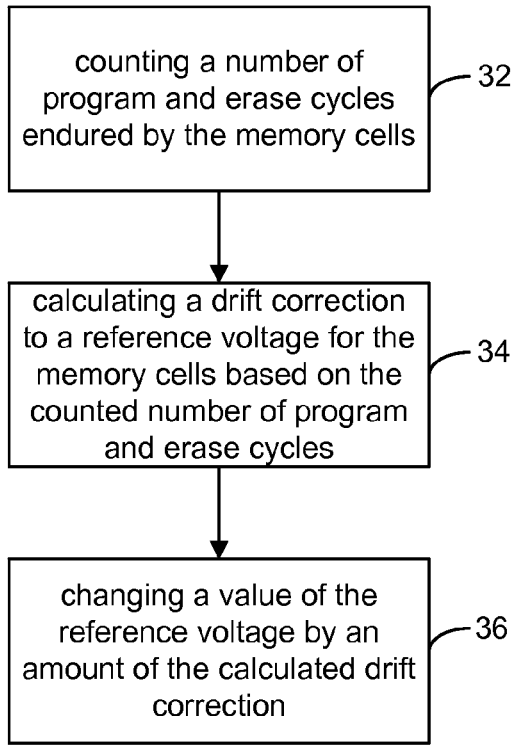
FIG. 6 is a flowchart illustrating an embodiment of a method of managing a plurality of memory cells.

FIG. 6 is a flowchart illustrating an embodiment of a method of managing a plurality of memory cells. In step 32, a number of program and erase cycles endured by the memory cells is counted. In step 34, a drift correction to a reference voltage for the memory cells is calculated based on the counted number of program and erase cycles. In step 36, a value of the reference voltage is changed by an amount of the calculated drift correction.

Figure 7:
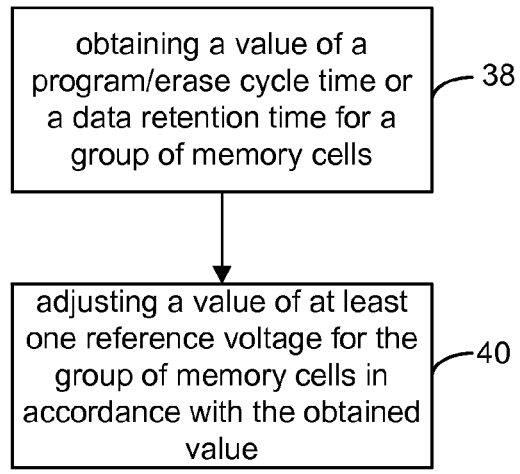
FIG. 7 is a flowchart illustrating another embodiment of a method of managing a plurality of memory cells.

FIG. 7 is a flowchart illustrating another embodiment of a method of managing a plurality of memory cells. In step 38, a value of a program/erase cycle time or a data retention time is obtained for a group of memory cells. In step 40, a value of at least one reference voltage for the group of memory cells is adjusted in accordance with the obtained value.

Figure 1:
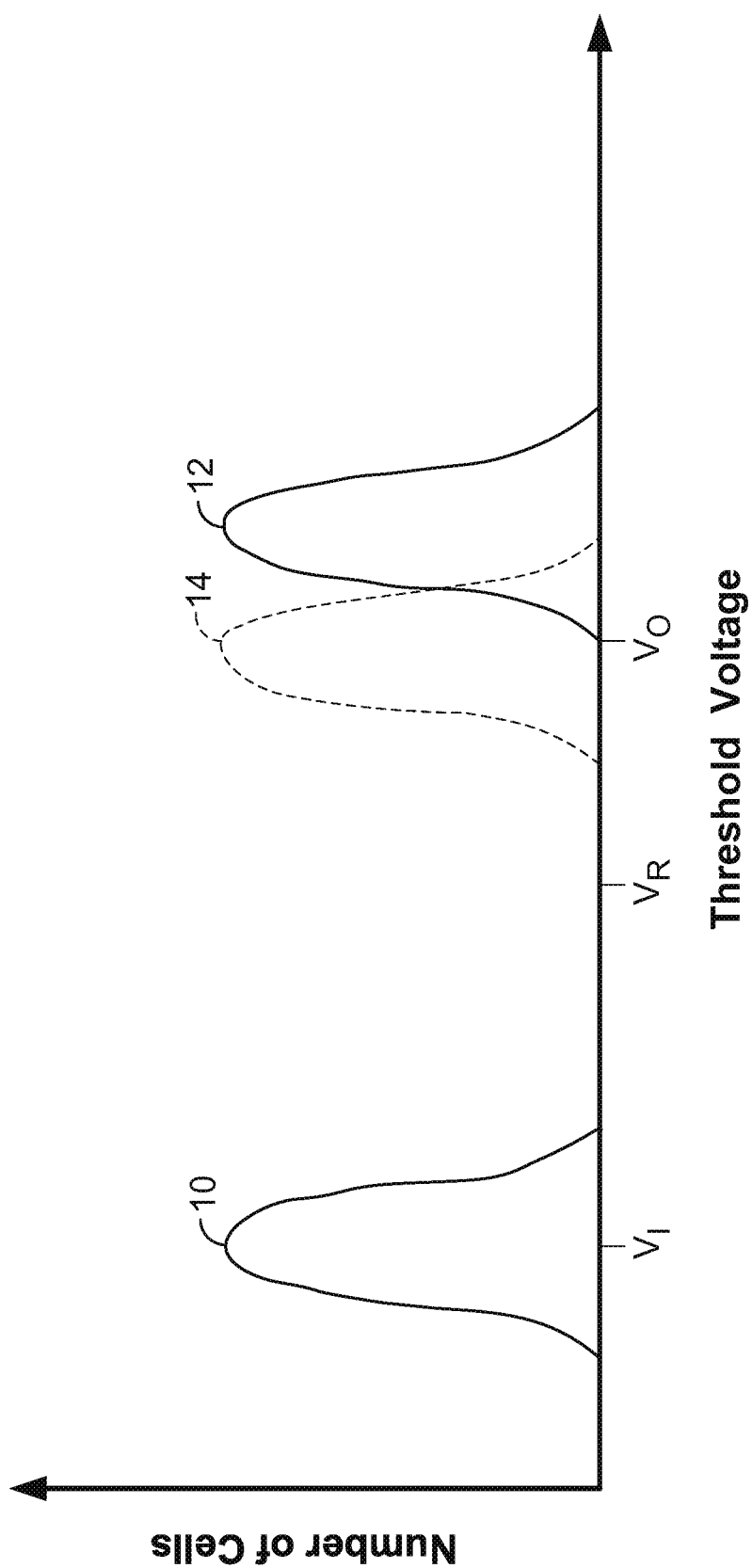
FIG. 1 (prior art) illustrates the storage of a bit in a SLC flash cell.
Figure 2:
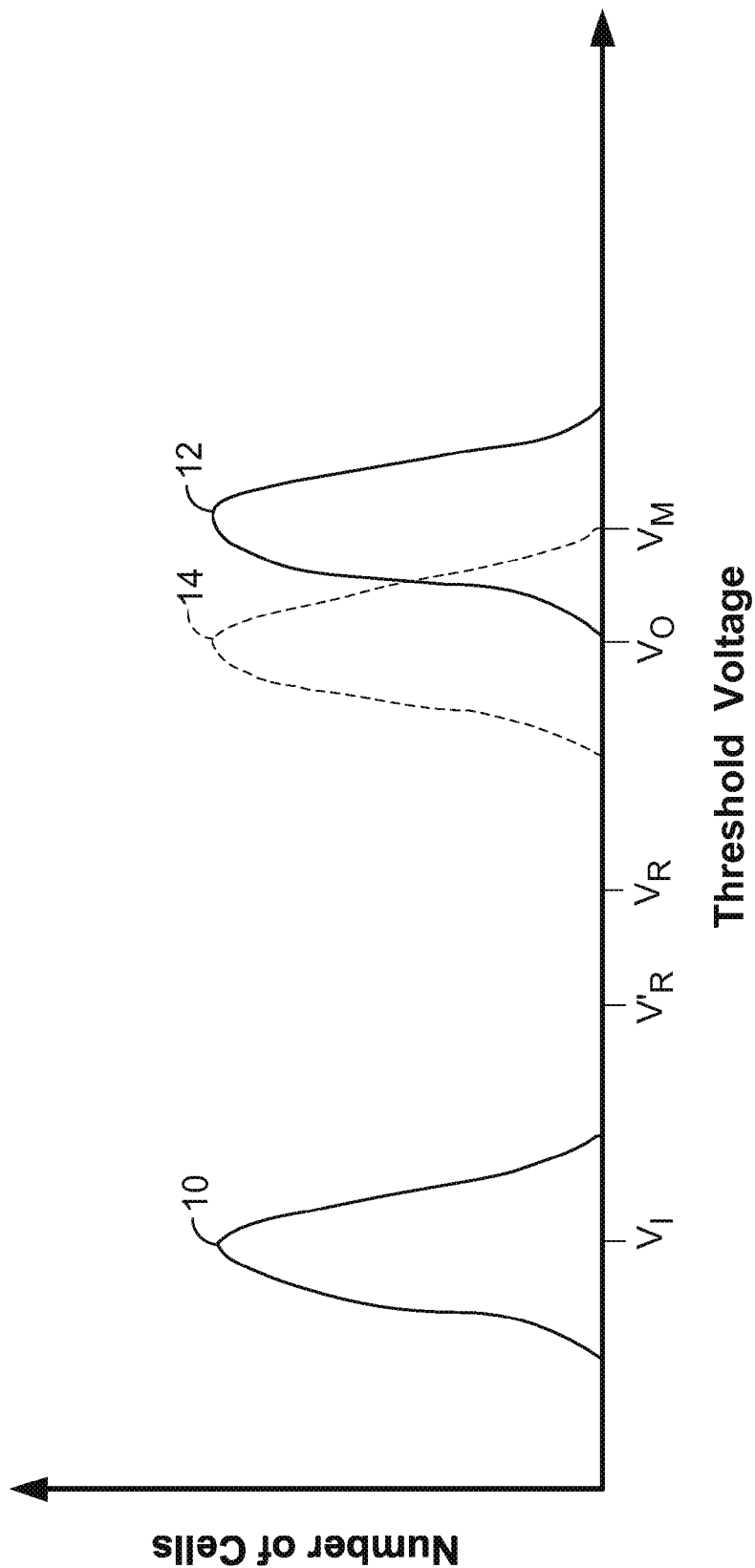
FIG. 2 illustrates the methods of the present invention as applied to the read threshold of a SLC flash memory.
Figure 3:
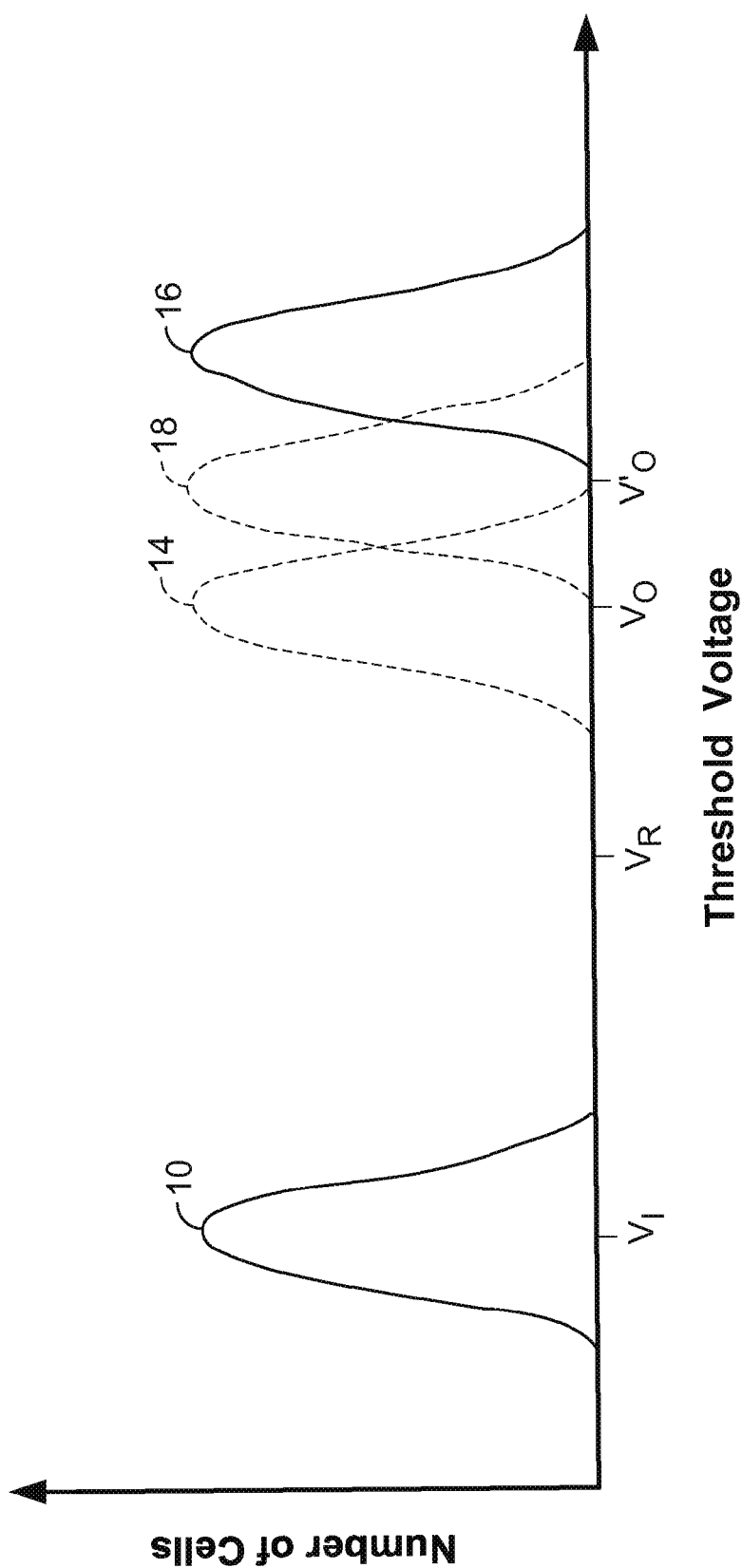
FIG. 3 illustrates the methods of the present invention as applied to the program verify threshold of a SLC flash memory.

Returning now to the drawings, FIG. 2 illustrates the general idea of the present invention as applied to read threshold voltage $V_R$ of a SLC flash memory. If the distribution curve of the threshold voltages of the cells that have been programmed to store zero bits has drifted from curve 12 to curve 14, then the value of the threshold voltage that is used as the read threshold voltage is lowered accordingly, from $V_R$ to $V_R'$. FIG. 3 illustrates the general idea of the present invention as applied to the program verify threshold $V_0$ of a SLC flash memory. If it expected that the distribution curve, of the threshold voltages of cells that are programmed to store zero bits by making the threshold voltages of the cells greater than $V_0$, will drift from curve 12 of FIG. 1 to curve 14 of FIG. 1, then a higher value $V_0'$ is used for the program verify threshold voltage, to make the initial distribution of threshold voltages be according to a curve 16 rather than curve 12 of FIG. 1, so that after the threshold voltages have drifted to a distribution curve 18, the lowest threshold voltage is at least as great as $V_0$ and $V_R$ still is a valid read threshold voltage value. Note that distribution curve 18 is substantially identical to distribution curve 12.

The present invention includes two general methods of estimating threshold voltage drift for the purpose of setting the values of reference voltages: an open loop method and a closed loop method.

Open Loop

According to the open loop method, the appropriate value to use for a reference voltage of a memory device is estimated according to an empirical model whose inputs are values of "environmental parameters". These environmental parameters are the factors described above that affect the reliability of data storage in the device. Some of these environmental parameters are historical parameters that reflect the history of the memory device. For example, the time since a block of flash cells has been programmed and the number of P/E cycles of that block are values of the environmental parameters "data retention time" and "P/E cycle count". Other environmental parameters, for example current temperature, are parameters related to present conditions.

Conceptually, the open loop model is:

$$\text{Next\_value} = f(\text{Present\_value}, \{P_i\})$$

where Present_value is the presently used value of a reference voltage, New_value is the improved value of the reference voltage that is predicted by the model, and $\{P_i\}$ is a set of values of environmental parameters. The simplest such models are linear models. Models of such simplicity often are adequate.

Example 1

A Model that Depends on the Number of P/E Cycles but not on the Data Retention Time This model is linear in the number of P/E cycles. For a block of a MLC flash memory device, the model is $$\text{Estimated\_drift} = \text{P/E\_coefficient} * \text{Band\_number\_coefficient} * \text{P/E\_count} + \text{P/E\_initial\_offset}.$$

where P/E coefficient is an empirically determined coefficient that applies to all the threshold voltage bands of the MLCs, Band_number_coefficient is an empirically determined coefficient that applies to a particular threshold voltage band (higher voltage bands are expected to drift more over time than lower voltage bands), P/E_count is the number of P/E cycles that the block has endured, P/E_initial_offset is an empirically determined constant offset and Estimated_drift is the amount by which the lower end of the band's threshold voltage distribution is estimated to drift downward. For example, if P/E_coefficient has been determined empirically to be $1.6 \times 10^{-5}$ V/cycle, if Band_number_coefficient for a particular band has been determined empirically to be 0.8 and P/E_initial_offset has been determined empirically to be 0.1V, then for a MLC block that has endured 30,000 P/E cycles (P/E_count=30,000), Estimated_drift is 0.484V. Either the read threshold voltage of the band is lowered by 0.484V or the program verify threshold of the band is raised by 0.484V.

The model for a block of a SLC flash memory device is similar, except that Band_number_coefficient is folded into P/E_coefficient. For example, if P/E_coefficient has been determined empirically to be $1.28 \times 10^{-5}$ V/cycle and P/E_initial_offset has been determined empirically to be 0.1V, then for a SLC block that has endured 30,000 P/E cycles, Estimated_drift is 0.484V. Ether the value of $V_R$ is lowered by 0.484V or the value of $V_0$ is raised by 0.484V.

Example 2

A Model that Depends on Data Retention Time but not on the Number of P/E Cycles

The model is linear in the data retention time. For a page of a MLC NAND flash memory device, the model is $$\text{Estimated\_drift} = \text{Data\_retention\_coefficient} * \text{Band\_number\_coefficient} * \text{Time\_since\_programmed} + \text{Data\_retention\_initial\_offset}.$$

where Data_retention_coefficient is an empirically determined coefficient that applies to all the threshold voltage bands of the MLCs, Band_number_coefficient is an empirically determined coefficient that applies to a particular threshold voltage band, Time_since_programmed is the time that has elapsed since the page was programmed, Data_retention_initial_offset is an empirically determined constant offset and Estimated_drift is the amount by which the lower end of the band's threshold voltage distribution is estimated to drift downward. For example, if Data_retention_coefficient has been determined empirically to be 0.08V/yr, if Band_number_coefficient for a particular band has been determined empirically to be 1.0 and Data_retention_initial_offset has been determined empirically to be 0.1V, then for a MLC page that last was programmed five years ago, Estimated_drift is 0.5V. Either the read threshold voltage of the band is lowered by 0.5V or the program verify threshold of the band is raised by 0.5V.

The model for a page of a SLC NAND flash memory device is similar, except that Band_number_coefficient is folded into Data_retention_coefficient. For example, if Data_retention_coefficient has been determined empirically to be 0.08V/yr and Data_retention_initial_offset has been determined empirically to be 0.1V, then for a SLC block that last was programmed five years ago, Estimated_drift is 0.5V. Either the value of $V_R$ is lowered by 0.5V or the value of $V_0$ is raised by 0.5V.

Closed Loop

The open loop coefficients and offsets are determined empirically from statistical measurements collected on a large population of flash cells. Because there is variation among different flash devices and among different blocks or pages within the same flash device, the open loop method requires a built-in safety margin that takes into account this variation. That the open loop method is based on global statistical data rather than on the properties of a specific set of memory cells limits the extent to which the open loop method can improve the performance of memory devices.

The closed loop methods of the present invention minimize the required safety margin and obtain more optimized threshold values. The drift is measured separately for each group (e.g., page or block) of cells to which the method is applied, thereby accounting for variation between different integrated circuit dies and between different blocks or pages on the same die.

The preferred closed loop methods of the present invention, as applied to the management of flash memories, estimate drift by comparing the threshold voltages of a group (e.g. a block or a page) of cells to a single reference threshold voltage (in the case of an SLC device) or to a single reference threshold voltage for each threshold voltage band above the lowest band (in the case of an MLC device). These comparisons provide statistics from which the drift of the "zero bit" threshold voltages (in the case of an SLC device) or the individual drifts of the threshold voltage bands above the lowest band (in the case of an MLC device) are estimated.

The present invention includes two kinds of closed loop methods: a postiori methods and a priori methods. The a postiori methods compare the threshold voltages of all the cells of a group (e.g., a block or a page) to all the reference threshold voltages. The a priori methods compare the threshold voltages of selected cells to single corresponding reference threshold voltages.

Referring again to FIG. 2 to explain the a postiori methods in the case of an SLC device, the methods are based on the observation that when a group of cells (e.g. a block or a page) is programmed, the statistics of the cells' threshold voltage distributions relative to selected reference threshold voltages are known. For example, it is known a priori that $V_0$ is a lower bound of the threshold voltages of the cells that are programmed to store zero bits and that half the cells that are programmed to store zero bits have threshold voltages higher than a median threshold voltage $V_M$ of the initial distribution 12. On the assumption that half of the cells are programmed to store one bits and that half of the cells are programmed to store zero bits, and given further assumptions about the shape of the threshold voltage distribution, the drift is estimated from the statistics of a comparison of the threshold voltages of the cells to $V_0$ or to $V_M$. The extent to which fewer than half the threshold voltages are above $V_0$ or the extent to which fewer than one-quarter of the threshold voltages are above $V_M$ indicates the extent of the drift. For example, if it is assumed that the "zero bit" threshold voltage distribution of a group (e.g. a page or a block) of SLC cells is initially Gaussian and remains Gaussian, and if it is assumed that the standard deviation of the distribution does not change, then if long after (e.g. three years after) the group was programmed, 15% of the threshold voltages still are above $V_M$, indicating that 30% of the "zero bit" threshold voltages still are above $V_M$, it follows that the "zero bit" threshold voltage distribution has drifted downwards by 0.52 of the standard deviation. As in the open loop methods, the read threshold voltage $V_R$ or the program verify threshold voltage $V_0$ is adjusted accordingly.

Groups (e.g. pages or blocks) of MLC cells are treated similarly, except that there are as many reference threshold voltages as there are threshold voltage bands above the lowest band. For example, one suitable set of reference threshold voltages is the initial median threshold voltages of the threshold voltage bands above the lowest band, analogous to the use of $V_M$ in the SLC case.

Similar methods are taught by Guterman et al. in U.S. Pat. No. 6,751,766 and by Ban in US Published Patent Application No. 2005/0013165; but these methods require the comparison of the cells' threshold voltages to more than one reference threshold voltage (SLC) or more than one reference threshold voltage per band above the lowest band (MLC). Using only one reference threshold voltage per band above the lowest band, as in the present invention, simplifies the construction of the flash memory of the present invention relative to those of the prior art of Guterman et al. and Ban.

One weakness of the a postiori closed loop methods of the present invention, as described so far, is the need to assume that when the cells were programmed, all the threshold voltage bands were equally populated. For example, in the SLC case, it is assumed that half the cells were programmed to store one bits and half the cells were programmed to store zero bits. This assumption could be relaxed if it were known a priori which cells were programmed to store one bits and which cells were programmed to store zero bits. The statistics on which the drift estimate is based then would be computed using only the cells that were programmed to store zero bits. Unfortunately, long after the cells were programmed, the only way to determine which cells were programmed to store one bits and which cells were programmed to store zero bits is to compare the cells' threshold voltages with the present value $V_R$ of the read threshold voltage. If the threshold voltages of some of the cells that were programmed to store zero bits have drifted below this value, then those cells are not included in the statistics, and the drift is underestimated.

One solution to this problem is to estimate the drift iteratively. The present value of the read threshold voltage is used to estimate which cells were programmed to store zero bits and which cells were programmed to store one bits. The drift of the cells that were programmed to store zero bits is estimated based on the statistics of the cells that are estimated to have been programmed to store zero bits. The read threshold voltage is adjusted accordingly, and the process is repeated until the set of cells that are estimated to have been programmed to store zero bits is identical to the same set from the previous iteration.

This a priori closed loop method is necessarily iterative because it is not known for sure, when the method starts, which cells store which data. A second a priori closed loop method of the present invention does not need to be iterative, because it is used shortly after the cells are programmed, while the data with which the cells are programmed still are available to the controller of the memory device, for example in an auxiliary volatile memory of the controller.

Figure 4:
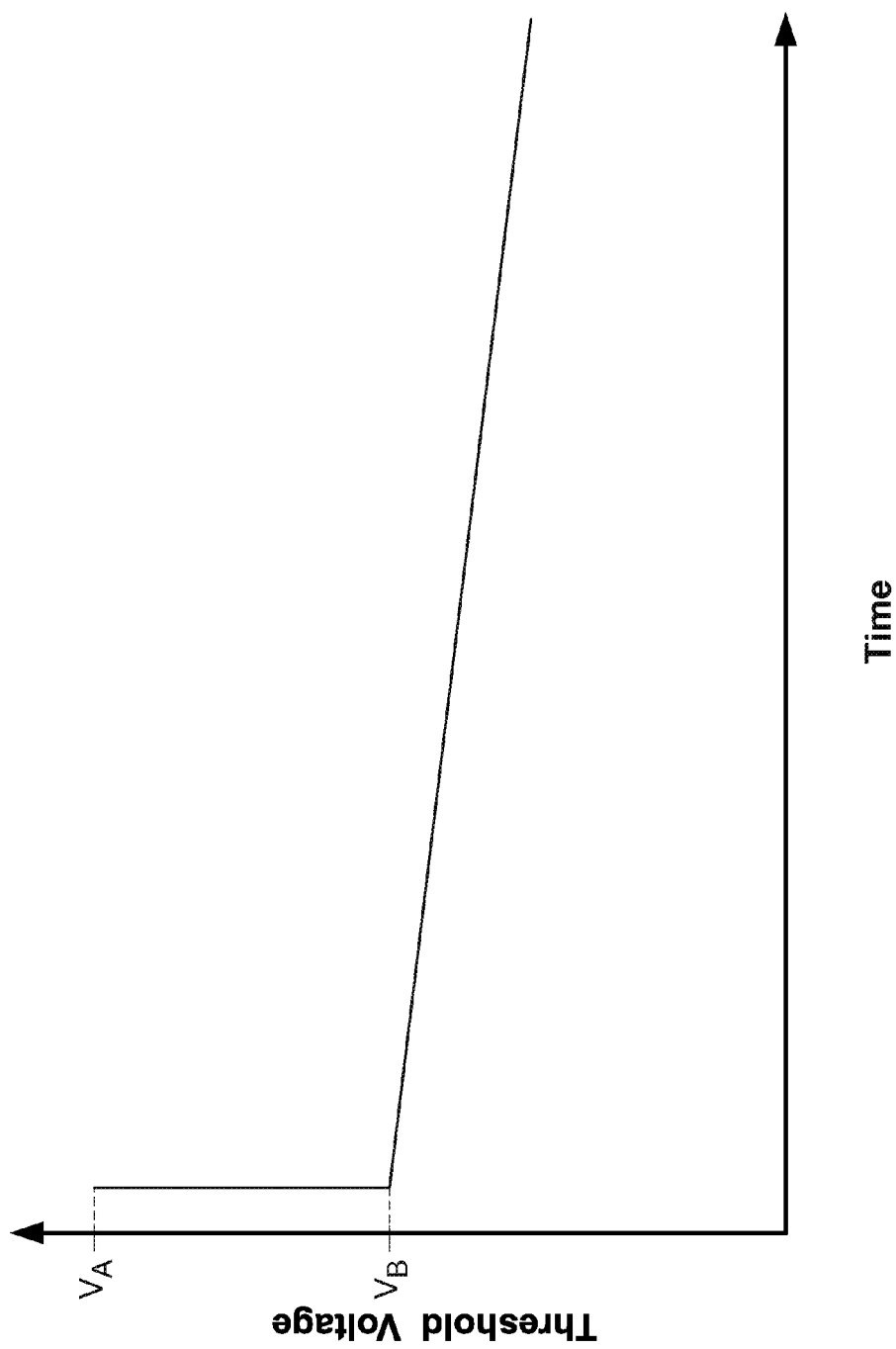
FIG. 4 illustrates the problem addressed by the second a priori closed loop method of the present invention.

FIG. 4 illustrates the problem addressed by the second a priori closed loop method. Specifically, FIG. 4 is a schematic plot of the lower bound of the "zero bit" threshold voltage of a SLC cell that has endured many P/E cycles. The cell is programmed by subjecting the cell to a train of programming voltage pulses until the cell's threshold voltage rises to an initial value $V_A$ that is greater than $V_0$. Almost immediately, within a few milliseconds, or even within only a few microseconds, the cell's threshold voltage falls to a lower value, $V_B$. The difference between $V_A$ and $V_B$ depends on how many P/E cycles the cell has endured. Subsequently, the downward drift of the cell's threshold voltage is much slower.

The second a priori closed loop method of the present invention measures the drift of a group (e.g. block or page) of flash cells shortly after the cells are programmed but long enough after the programming for the initial sudden drift of the threshold voltage distribution to have occurred. In the SLC case, this means that the lower bound of the "zero bit" threshold voltage distribution, that was programmed to be $V_0$, now is less than $V_0$ by an amount approximately equal to $(V_A-V_B)$. Because the flash controller still has stored in its auxiliary volatile memory the data values with which the cells were programmed, the extent of the initial sudden drift can be estimated from the statistics of only the cells that were programmed to store zero bits, as described above. Then, based on that estimate, either the value of the read threshold voltage is decreased by the estimated drift from $V_R$ to $V_R'$, as illustrated in FIG. 2, or the value of the program verify threshold voltage for subsequent programming is increased by the estimated drift from $V_0$ to $V_0'$ as illustrated in FIG. 3.

Typically, the open loop methods of the present invention, the a postiori closed loop methods of the present invention and the first a priori closed loop methods of the present invention are used when reading a group of flash cells long after the flash cells have been programmed, in order to adjust the read threshold voltage value (or the read threshold voltage values, in the MLC case) for the drift that the cells' threshold voltages have undergone since the cells were programmed, and/or in order to adjust the program verify threshold voltage value (or the program verify threshold voltage values, in the MLC case) for subsequent programming. By contrast, the second a priori closed loop method of the present invention is intended to be used in conjunction with programming, independent of whether the programmed data ever will be read. If the cells subsequently are erased and reprogrammed, even without having been read in the interim, the program verify threshold voltage value(s) that is/are used in the second programming are adjusted in accordance with the value(s) of the sharp initial drift(s) that was/were estimated shortly after the first programming.

The first time that an a postiori closed loop method or one of the first a priori closed loop methods is used, the read threshold voltage value(s) or the program verify threshold voltage value(s) is/are adjusted relative to its/their initial value(s). Subsequently (for example, if the data are programmed once and then read annually), the read threshold voltage value(s) or the program verify threshold value(s) may be adjusted either relative to its/their initial value(s) or incrementally, relative to its/their previously adjusted value(s).

One advantage of the second a priori closed loop method of the present invention over the other preferred embodiments of the methods of the present invention is that the second a priori closed loop method uses the data that actually were programmed into the cells to select the cells that are used to estimate the drift. Even the first a priori closed loop method only estimates these data iteratively. Another advantage of the second a priori closed loop method of the present invention over the other closed loop methods of the present invention is that the supporting assumptions about the nature of the threshold voltage distribution, for example that the shape of the distribution does not change, are much more likely to be valid shortly after the cells are programmed, during the time-window-of-opportunity from when the initial fast drift stops until the data disappear from the auxiliary volatile memory, than several years after the cells are programmed.

Figure 5:
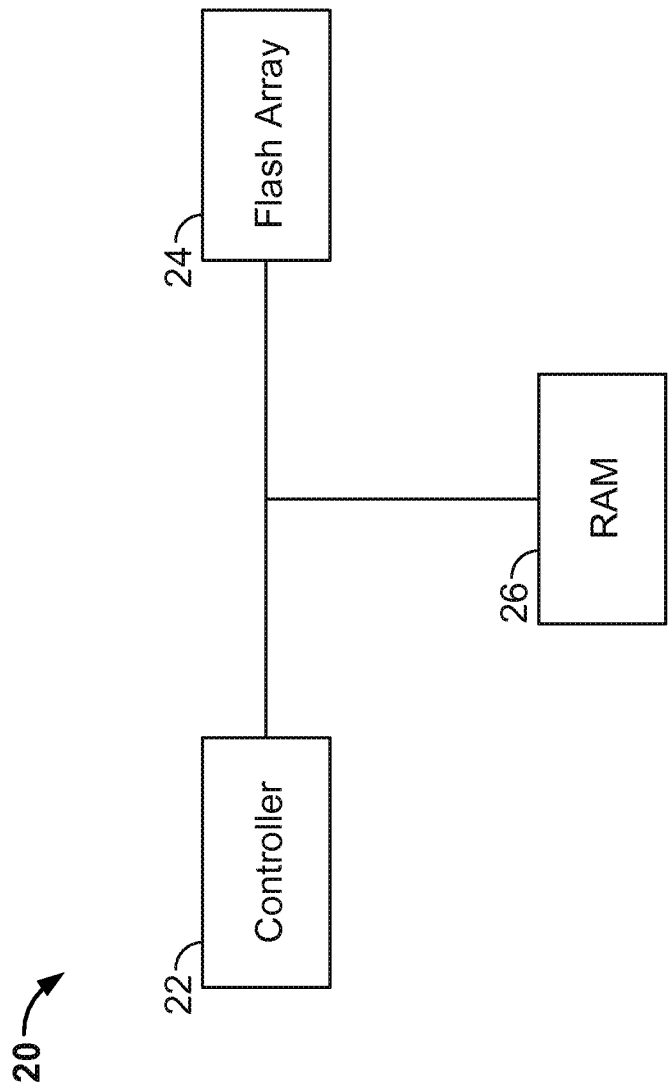
FIG. 5 is a high-level schematic block diagram of a flash memory device of the present invention.

FIG. 5 is a high-level schematic block diagram of a flash memory device 20 of the present invention. FIG. 5 is adapted from FIG. 1 of Ban, U.S. Pat. No. 5,404,485, which patent is incorporated by reference for all purposes as if fully set forth herein. Flash memory device 20 includes an array 24 of flash memory cells, a controller 22 and a random access memory (RAM) 26. Controller 22, that corresponds to "flash control 14" of U.S. Pat. No. 5,404,485, manages flash array 24, with the help of RAM 26, as described in U.S. Pat. No. 5,404,485. If flash array 24 is a NAND flash array, then controller 22 preferably also manages flash array 24 as taught in Ban, U.S. Pat. No. 5,937,425, which patent also is incorporated by reference for all purposes as if fully set forth herein. In addition, controller 22 estimates the drift of the threshold voltages of flash array 24, or of portions (e.g. blocks or pages) of flash array 24, as described herein and adjusts the reference voltages that controller 22 uses to manage flash array 24 in accordance with the estimated drift or drifts. In particular, in implementing the second a priori closed loop method of the present invention, controller 22 uses the fact that the data, that are needed by the method to select which flash cells are to participate in the estimate of the drift, are still present in RAM 26.

While the invention has been described with respect to a limited number of embodiments, it will be appreciated that many variations, modifications and other applications of the invention may be made.

We claim:

1. A method of managing a plurality of memory cells, comprising:
   counting a number of program and erase cycles endured by the memory cells;
   calculating a drift correction to a reference voltage for the memory cells based on the counted number of program and erase cycles; and
   changing a value of the reference voltage by an amount of the calculated drift correction, wherein the reference voltage is a read voltage and further comprising decreasing the read voltage in proportion to the calculated drift correction.

2. The method of claim 1, wherein the read voltage is decreased in linear proportion to the calculated drift correction.

3. The method of claim 1, wherein the reference voltage is a verify voltage, further comprising increasing the verify voltage in proportion to the calculated drift correction.

4. The method of claim 1, wherein the verify voltage is increased in linear proportion to the calculated drift correction.

5. The method of claim 1, wherein the drift correction is calculated in accordance with the relationship:

(drift correction)=(P/E coefficient)×(band-number coefficient)×(P/E count)+(P/E initial offset);

wherein the P/E coefficient is an empirically determined coefficient that applies to all threshold voltage bands,
   wherein the band-number coefficient is an empirically determined coefficient that applies to a particular threshold voltage band,
   wherein the P/E count is a number of program and erase cycles that the memory cells have endured, and
   wherein the P/E initial offset is an empirically determined constant offset.

6. A memory device, comprising:
   a plurality of memory cells; and
   a controller to manage the plurality of memory cells, said controller counts a number of program and erase cycles endured by the memory cells, calculates a drift correction to a reference voltage for the memory cells based on the counted number of program and erase cycles, and changes a value of the reference voltage by an amount of the calculated drift correction wherein the controller calculates the drift correction in accordance with the relationship:

$$(\text{drift correction}) = (\text{P/E coefficient}) \times (\text{band-number coefficient}) \times (\text{P/E count}) + (\text{P/E initial offset});$$

wherein the P/E coefficient is an empirically determined coefficient that applies to all threshold voltage bands, wherein the band-number coefficient is an empirically determined coefficient that applies to a particular threshold voltage band, wherein the P/E count is a number of program and erase cycles that the memory cells have endured, and wherein the P/E initial offset is an empirically determined constant offset.

7. The memory device of claim 6, wherein the reference voltage is a read voltage, and the controller decreases the read voltage in proportion to the calculated drift correction.

8. The memory device of claim 6, wherein the reference voltage is a verify voltage, and the controller increases the verify voltage in proportion to the calculated drift correction.

9. A method of managing a plurality of memory cells, comprising:

obtaining a value of a program/erase cycle time or a data retention time for a group of memory cells; and adjusting a value of at least one reference voltage for the group of memory cells in accordance with the obtained value by decreasing the at least one reference voltage in proportion to the calculated drift correction.

10. The method of claim 9, wherein said adjusting includes adjusting a plurality of reference voltages for respective threshold voltage bands in a manner specific to respective threshold voltage bands.

11. A memory device, comprising:

a plurality of memory cells organized into groups; and a controller to manage said plurality of memory cells, said controller obtains a value for each group of a program/erase cycle count or a data retention time, and for each group, adjusts a value of at least one reference voltage for the group in accordance with said the obtained value of the historical parameter by decreasing the value of the at least one reference voltage for the group.

12. The memory device of claim 11, wherein said controller adjusts a plurality of reference voltages for respective threshold voltage bands in a manner specific to said respective threshold voltage bands.

* * * * *